(12) United States Patent
Cosemans et al.

(10) Patent No.: US 11,342,261 B2
(45) Date of Patent: May 24, 2022

(54) INTEGRATED CIRCUIT WITH AN INTERCONNECTION SYSTEM HAVING A MULTILEVEL LAYER PROVIDING MULTILEVEL ROUTING TRACKS AND METHOD OF MANUFACTURING THE SAME

(71) Applicant: IMEC VZW, Leuven (BE)

(72) Inventors: Stefan Cosemans, Leuven (BE); Julien Ryckaert, Schaerbeek (BE); Zsolt Tokei, Leuven (BE)

(73) Assignee: IMEC VZW, Leuven (BE)

( * ) Notice: Subject to any disclaimer, the term of this patent is extended or adjusted under 35 U.S.C. 154(b) by 98 days.

(21) Appl. No.: 16/721,277

(22) Filed: Dec. 19, 2019

(65) Prior Publication Data
US 2020/0203273 A1    Jun. 25, 2020

(30) Foreign Application Priority Data

Dec. 19, 2018    (EP) .................................... 18214146

(51) Int. Cl.
| | | |
|---|---|---|
| *H01L 23/522* | (2006.01) | |
| *H01L 21/768* | (2006.01) | |
| *H01L 23/528* | (2006.01) | |

(52) U.S. Cl.
CPC .... *H01L 23/5226* (2013.01); *H01L 21/76808* (2013.01); *H01L 21/76877* (2013.01);
(Continued)

(58) Field of Classification Search
CPC ....... H01L 21/76897; H01L 21/76808–76813; H01L 23/5226; H01L 23/5221; H01L 23/5283; H01L 21/76811; H01L 21/76816; H01L 21/76807–76813; H01L 2221/1015–1036; H01L 21/76877;
(Continued)

(56) References Cited

U.S. PATENT DOCUMENTS

| | | | | |
|---|---|---|---|---|
| 4,962,058 A | * | 10/1990 | Cronin | .............. H01L 21/76897 438/622 |
| 5,136,124 A | * | 8/1992 | Cronin | .............. H01L 21/32053 174/261 |

(Continued)

FOREIGN PATENT DOCUMENTS

| | | |
|---|---|---|
| EP | 0288802 A1 | 11/1988 |
| WO | 2015/047830 A1 | 4/2015 |

(Continued)

OTHER PUBLICATIONS

European Search Report, European Patent Application No. 18214146. 5,. dated Jun. 26, 2019, 9 pages.
(Continued)

*Primary Examiner* — Younes Boulghassoul
(74) *Attorney, Agent, or Firm* — McDonnell Boehnen Hulbert & Berghoff

(57) ABSTRACT

Integrated circuit comprising an interconnection system comprising at least one multilevel layer comprising first parallel electrically conductive lines, the multilevel layer comprising at least three levels forming a centerline level, an upper extension line level, and a lower extension line level the levels providing multilevel routing tracks in which the lines extend.

17 Claims, 8 Drawing Sheets

(52) U.S. Cl.
CPC .. *H01L 21/76885* (2013.01); *H01L 21/76897* (2013.01); *H01L 23/5221* (2013.01); *H01L 23/5283* (2013.01)

(58) Field of Classification Search
CPC ......... H01L 21/76883; H01L 21/76885; H01L 21/76895; H01L 23/528; H01L 23/5286
See application file for complete search history.

(56) References Cited

U.S. PATENT DOCUMENTS

| | | | | |
|---|---|---|---|---|
| 5,189,506 A * | 2/1993 | Cronin | ................ | H01L 21/7688 257/752 |
| 5,248,854 A * | 9/1993 | Kudoh | .............. | H01L 21/76885 174/261 |
| 5,539,255 A * | 7/1996 | Cronin | .............. | H01L 21/76877 257/750 |
| 6,331,734 B1 * | 12/2001 | Hieda | ................ | H01L 23/5228 257/775 |
| 6,426,558 B1 * | 7/2002 | Chapple-Sokol | ... | H01L 23/5226 257/758 |
| 6,815,820 B2 * | 11/2004 | Yu | ..................... | H01L 21/76807 257/758 |
| 7,285,859 B2 * | 10/2007 | Hasunuma | ........ | H01L 21/76816 257/758 |
| 10,978,343 B2 * | 4/2021 | Park | .................. | H01L 21/76885 |
| 2004/0113238 A1 * | 6/2004 | Hasunuma | .......... | H01L 23/3677 257/636 |
| 2008/0076244 A1 * | 3/2008 | Ye | ..................... | H01L 21/76808 438/597 |
| 2008/0108215 A1 * | 5/2008 | Parikh | ................ | H01L 23/5283 438/597 |
| 2008/0261155 A1 * | 10/2008 | Borzenko | ........... | H01L 23/5221 430/311 |
| 2009/0200683 A1 | 8/2009 | Colburn et al. | | |
| 2012/0086128 A1 * | 4/2012 | Ponoth | .............. | H01L 21/76885 257/774 |
| 2013/0285246 A1 * | 10/2013 | Chang | ............... | H01L 21/76838 257/758 |
| 2015/0348832 A1 | 12/2015 | Bruce et al. | | |
| 2015/0371896 A1 | 12/2015 | Chen et al. | | |
| 2016/0056107 A1 * | 2/2016 | Kuwajima | ........ | H01L 21/76808 257/532 |
| 2016/0155701 A1 | 6/2016 | Mignot et al. | | |
| 2016/0197011 A1 * | 7/2016 | Bristol | .............. | H01L 21/76811 257/760 |
| 2017/0294347 A1 | 10/2017 | Chi et al. | | |
| 2018/0151488 A1 * | 5/2018 | He | ..................... | H01L 21/76846 |
| 2018/0261497 A1 * | 9/2018 | Drissi | ............... | H01L 21/76816 |
| 2018/0269152 A1 | 9/2018 | Sengupta et al. | | |
| 2018/0323100 A1 * | 11/2018 | Nyhus | ............... | H01L 21/31144 |
| 2019/0157150 A1 * | 5/2019 | Park | ........................ | H01L 21/78 |
| 2019/0237366 A1 * | 8/2019 | Yang | ................ | H01L 23/5226 |
| 2019/0237399 A1 * | 8/2019 | Dobbins | ................. | H01L 23/66 |
| 2019/0355620 A1 * | 11/2019 | Freed | ................ | H01L 21/02175 |
| 2020/0075478 A1 * | 3/2020 | Kim | .................... | H01L 25/0657 |
| 2021/0313222 A1 * | 10/2021 | Guler | ............... | H01L 21/76808 |

FOREIGN PATENT DOCUMENTS

| | | |
|---|---|---|
| WO | 2017/105445 A1 | 6/2017 |
| WO | 2017/111926 A1 | 6/2017 |
| WO | 2017/111953 A1 | 6/2017 |
| WO | 2017/204820 A1 | 11/2017 |
| WO | 2017/204821 A1 | 11/2017 |

OTHER PUBLICATIONS

Lapedus, Mark, "Inside Lithography And Masks", Semiconductor Engineering, https://semiengineering.com/inside-lithography-and-masks-3, Aug. 27, 2018, pp. 1-15.

* cited by examiner

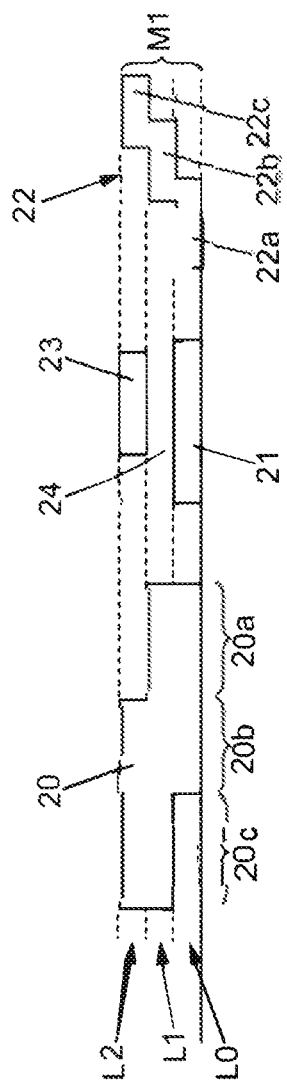
FIG. 1
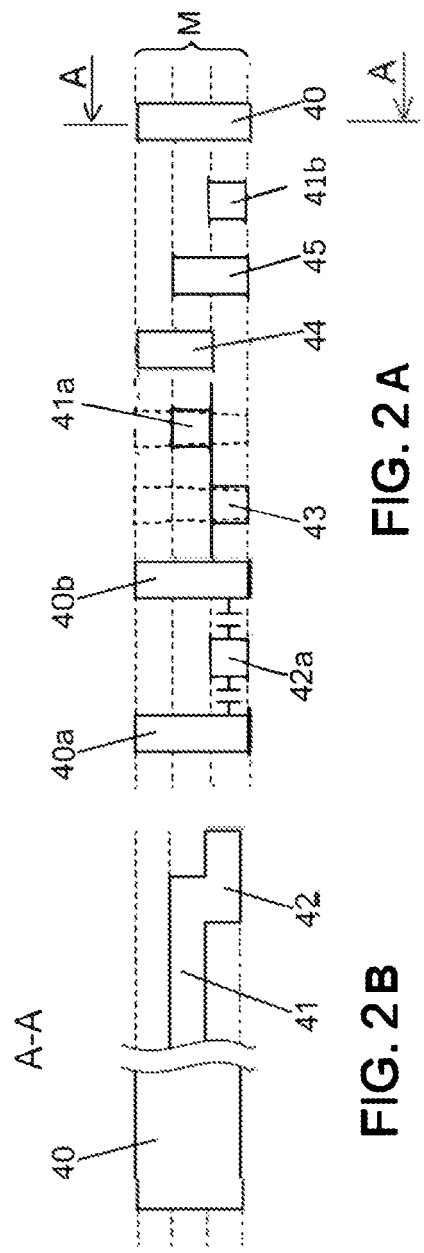
FIG. 2A
FIG. 2B

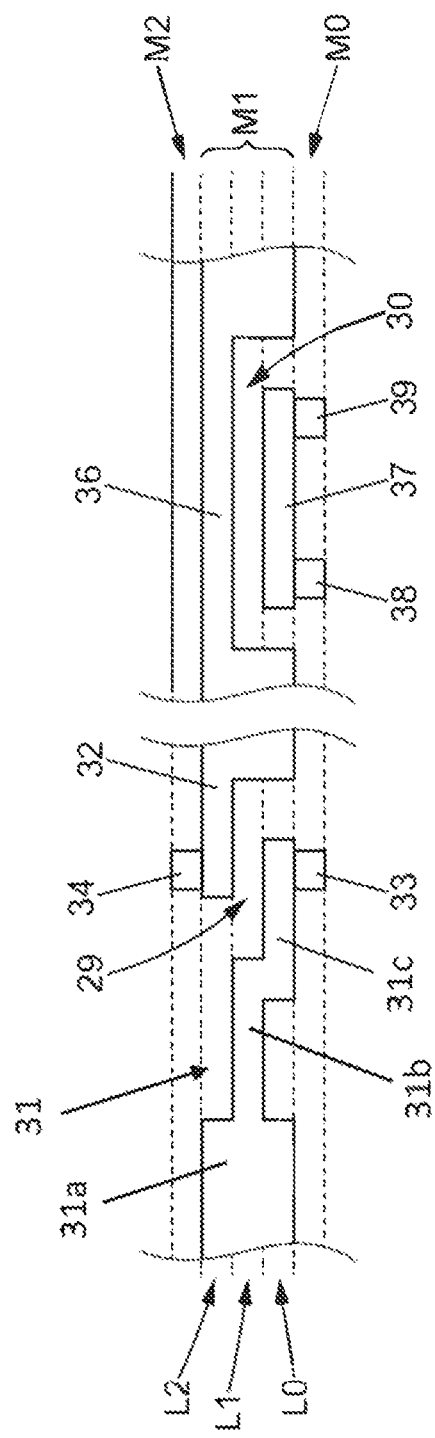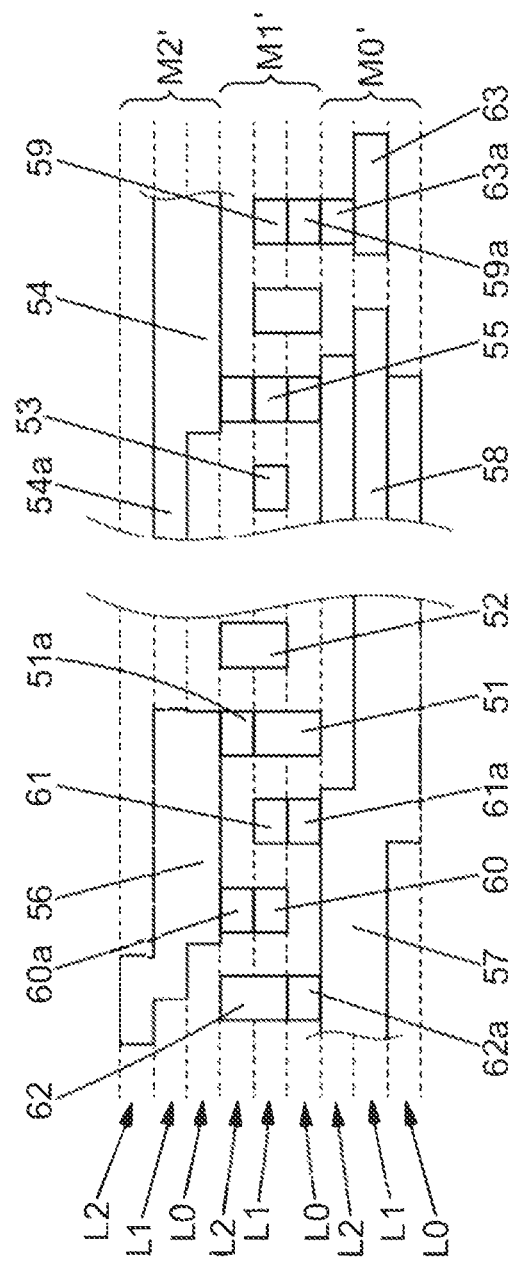

INTEGRATED CIRCUIT WITH AN INTERCONNECTION SYSTEM HAVING A MULTILEVEL LAYER PROVIDING MULTILEVEL ROUTING TRACKS AND METHOD OF MANUFACTURING THE SAME

CROSS-REFERENCE TO RELATED APPLICATIONS

The present application is a non-provisional patent application claiming priority to European Patent Application No. 18214146.5, filed Dec. 19, 2018, the contents of which are hereby incorporated by reference.

FIELD OF THE DISCLOSURE

The present disclosure concerns an interconnection system in integrated circuits which provides internal connections between conductive lines in layers of such integrated circuits.

BACKGROUND

Back end of line (BEOL) connections, where individual devices of an integrated circuit (transistors, capacitors, resistors, etc.) are interconnected with wiring on a wafer are traditionally realized using layers of metal at different height and vias that connect two metallization layers. The vias may be carefully aligned to the metal above and the metal below. In recent technology nodes, the alignment to the top metal is ensured by using a self-aligned "trench via" approach, where the physical via is only created where both top metal and trench via overlap. For the alignment between via and bottom metal, no self-alignment scheme is currently available.

An example of self-aligned via design is given in document US2017/0294347 A1 and document WO 2017/105445 describes a grid self-aligned metal via processing scheme for back end of line interconnect comprising metallization layers comprising alternating metal lines and dielectric lines and a method of fabricating an interconnect structure for a semiconductor die.

A problem that arises with usual self-aligned via schemes is that the VIA mask must aim correctly on the bottom metallization layer. Otherwise, it can short to a neighboring line of the target bottom metallization layer. This problem is important in scaled technology nodes.

In addition the routing capabilities are limited.

The disclosure aims to improve the routing capabilities in term of alignment, in term of flexibility in R/C optimization and routing flexibility.

SUMMARY

To that end, the present disclosure proposes an integrated circuit comprising an interconnection system characterized in that the interconnection system comprises at least one multilevel layer comprising first parallel electrically conductive lines, the multilevel layer comprising at least three levels forming a centerline level, an upper extension line level and a lower extension line level, the levels providing multilevel routing tracks in which the lines extend.

The wording given above "multilevel routing tracks" designates boundaries in which are created uninterrupted lines potentially at different levels in the metallization layer.

Embodiments of the present disclosure allow flexibility in connecting lines between levels and increases the routing possibilities.

In an embodiment of the disclosure, conductive lines within the layer comprise upwards or downwards extensions providing conductive lines of different and/or varying thickness within their layer which permits to build conductive lines having various heights and length within a single layer.

In other embodiments which may be combined:
- at least some of the conductive lines, within the multilevel routing track layer, change of level upwards or downwards within the centerline level, upper extension line level and lower extension line level;
- at least some of the conductive lines within the multilevel routing track are routed at least locally above one another in the upper extension line level and lower extension line level inside the multilevel routing track, an insulation layer being inserted in the centerline level between the conductive lines routed above one another.

This allows a line to pass over or under another line.

This embodiment reduces routing congestion in allowing provision of two signal lines levels in a layer with conductive lines, instead of adding metal and via layers which is costly.

In an embodiment of the disclosure the multilevel layer is positioned under an upper layer and a connection between a conductive line of the multilevel layer and a conductive line of the upper layer is made through a locally arranged up extension of the conductive line of the multilevel layer.

Alternately or additionally, the multilevel layer is positioned above a lower layer and connections between conductive lines of the multilevel layer and a conductive line of the lower layer is done through a locally arranged down extension of the conductive line of the multilevel layer.

In a further embodiment, the lower and upper layers being further multilevel layers, connections between conductive lines of an upper multilevel layer and conductive line of a lower multilevel layer is made through a locally arranged down extension of the conductive line of the upper multilevel layer and locally arranged up extension of the conductive line of the lower multilevel layer.

This provides localized connection points between lines of adjacent layers.

In a further embodiment, the multilevel layer is a middle layer comprising at least locally a first conductive line in the upper extension line level having a first connection to a first crossing conductive line of an upper layer, the middle layer comprising further at least second locally a conductive line in the lower extension line level having a second connection to a second crossing conductive line of a lower layer and an insulating layer is located in the centerline level between the first and second connections, the first and second conductive lines being in a same routing track within the middle layer.

This permits connecting the lines of an intermediate layer to lines of an upper layer and lines of a lower layer in a same vertical axis thus saving place for the routing.

In further embodiments:
- the upper layer being a multilevel layer, the first connection is made through a locally arranged down extension of the first crossing conductive line in the upper layer.
- the lower layer being a multilevel layer, the second connection is made through a locally arranged up extension of the second crossing conductive line in the lower layer.

In additional or complementary embodiments, the multilevel routing track of the disclosure further allows:

the provision of both thick and thin lines within a layer providing an adaptation between resistance and capacitance of the lines;

the provision of staggered parallel lines thus reducing capacitive coupling between adjacent lines within the multilevel layer.

According to the disclosure, the levels being defined as horizontal levels, the routing tracks provide vertical self-alignment of upper or lower extensions of multilevel lines within the layer.

In a specific embodiment, the interconnection system of the disclosure is provided with at least three multilevel routing tracks layers each having three levels.

The disclosure concerns also a process for making an interconnection system in an integrated circuit, the process comprising:

forming a multilevel layer comprising first parallel electrically conductive lines, the multilevel layer comprising at least three levels constituting a centerline level, an upper extension line level and a lower extension line level, whereby the levels provide multilevel routing tracks in which the conductive lines extend, the conductive lines comprising conductive parts having longitudinal sidewalls perpendicular to the plane of the layer, the longitudinal sidewalls of the conductive parts of the lines being aligned inside a multilevel routing track.

In a first embodiment, conductive parts are formed by dual damascene processing thereby aligning the sidewalls, providing a lithographic pattern exposing conductive parts in the dual damascene stack and etch-back of exposed conductive parts thereby forming a trench, and filling the trench with a dielectric material.

The process may comprise selectively removing an upper portion of the dielectric material in the trench, and filling the upper portion of the trench with conductive material.

Conductive parts may also be formed by depositing a stack of conductive material(s), patterning the conductive stack and forming a dielectric stack surrounding the conductive stack thereby leaving the upper surface of the conductive stack exposed, providing a lithographic pattern exposing part of the upper surface and etch-back of exposed part of the upper portion of the conductive stack thereby forming a trench, and filling the trench with a dielectric material.

The stack of conductive material(s) may then be deposited on a patterned dielectric layer.

In embodiments of the present disclosure, both the downwards (bottom) extensions and the upwards (top) extensions remain self-aligned to the centerline of the corresponding lines. Additionally, the multilevel routing track in one layer increases the margin available for connecting two consecutive metallization layers.

BRIEF DESCRIPTION OF THE FIGURES

The above, as well as additional, features will be better understood through the following illustrative and non-limiting detailed description of example embodiments, with reference to the appended drawings.

FIG. 1 is a schematic lateral view of the principle of the disclosure;

FIGS. 2A, 2B are respectively a schematic front view and right cross sectional view of possible embodiments within one layer according to the disclosure;

FIG. 3 is a schematic lateral view of routing examples with layers above and under the layer of the disclosure;

FIG. 4 is a schematic lateral view of principle specific embodiment of the disclosure with three multilevel layers for a BEOL part of an integrated circuit of the disclosure;

Figure 5:
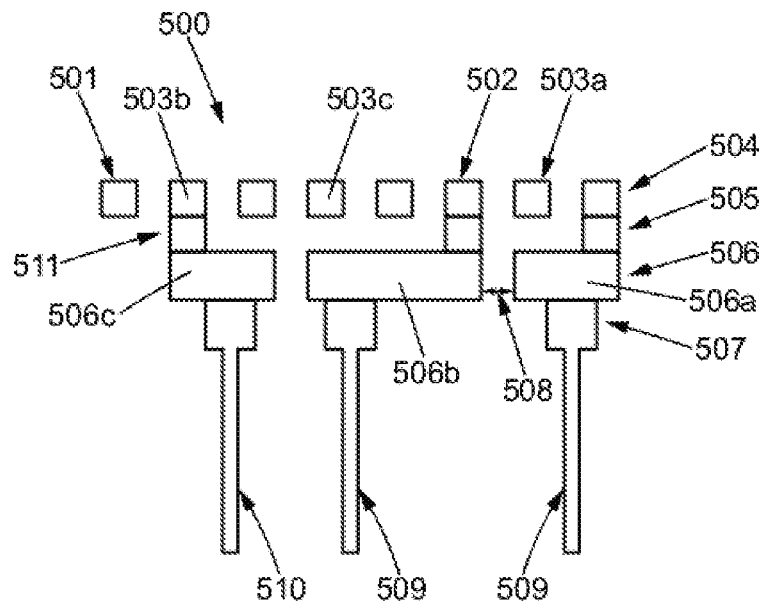
FIG. 5 is a schematic representation of a prior art source-drain connection system in cross section between two gates.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure concerns improved internal routing in an integrated circuit such as for example the Back end of line (BEOL) connections of such integrated circuit. In traditional routing layers, each layer comprise parallel lines in one plane and lines of adjacent layers are perpendicular, with VIA layers providing point connectivity between crossing lines of adjacent layers. In the present disclosure, rather than all conductive lines of a layer lying in a single level where these lines are parallel and at the same level, the lines of a layer of the disclosure may lie in different levels, that is at different altitude in the layer.

FIG. 1 discloses a layer M1 of the disclosure with multiple levels L0, L1, L2 in a direction perpendicular to the plane of the layer. The layer is then referred to as a layer with multilevel routing tracks, the three levels form a centerline level L1, an upper extension line level L2 and a lower extension line level L0 that lie in a plane perpendicular to the plane of the layer. In the present disclosure, the longitudinal sidewalls of the parts inside a multilevel routing track at adjacent levels are self-aligned. Accordingly, the parts in the multilevel track are coaxial to each other and have the same width. As a result, the sidewalls of those parts, which are parallel to the routing track and perpendicular to the plane defining the layer, are coplanar.

In this first example, the lines of the layer which are extending parallel to a first direction referred to as a longitudinal direction of the layer, follow multilevel routing tracks in a plane perpendicular to the layer plane. This allows several possibilities.

First the multilevel routing tracks permits to build lines having a height of more than one level such as part 20b of line 20 extending on the three levels of the layer and part 20a and 20c of line 20 extending on two levels, upper levels for part 20c and lower levels for part 20a.

Second, the routing tracks allow the lines to change levels such as line 20 and also line 22 which has a first part 22a on the lower extension line level L0, a second part 22b on the centerline level L1 and third part 22c on the upper extension line level L2.

In addition to the disclosure allows lines in a single layer to extend one above the other such as lines 21 and 23 where line 21 is in the lower extension line level L0 and line 23 is in the upper extension line level L2. These conductive lines 21, 23 are separated by insulating material 24 in the centerline level L1.

As seen above, the multilevel layer scheme of the disclosure can be used to make both thick wires 20 or thin wires 21 in a vertical direction in the multilevel layer M. This allows a better trade-off between resistance and capacitance of the lines and allows providing two lines one above each other.

FIG. 2A represents a front view of different types of parallel lines extending in a longitudinal direction in a layer M of the disclosure with three levels. Such layer includes low resistance lines 40, 40a, 40b, one level low capacitance lines 41a, 41b, 42a and 43 and medium lines of two levels 44, 45.

FIG. 2A shows also in a same layer a one level height conductive line 42a between two three levels height conductive lines 40a, 40b which reduces parasitic capacitance of the three levels lines without sacrificing a routing track.

In addition, putting neighboring lines at different levels, such as single level lines 43 lying in the lower extension level and single level line 41a lying in the centerline limits parallel wires coupling. This can also be done with two levels lines such as lines 44, 45. Staggering neighboring wires provides reduction in capacitance.

FIG. 2B provides a cross sectional view of FIG. 2A along line AA which shows that a line may have a varying section e.g.: one level segments 41, 42 at different levels and a thick segment 40.

To summarize, FIGS. 2A and 2B indicates how the different levels available in a metallization layer result in a different trade-off between R and C.

The multilevel layer of the disclosure also allows a more suited choice of the heights of each level using design technology co-optimization (DTCO).

However, in some embodiments when a multilevel layer M1 is sandwiched between an upper and lower layers some limitations apply since lines in the upper L2 and lower L0 extensions levels of the multilevel layer does not make shorts circuits with lines or connection areas of the upper and lower layers.

It should be noted that FIGS. 1 and 2 show several possible wiring embodiments in a condensed format for conciseness and do not reflect a specific working wiring.

In addition, some process flows, for example SADP self-aligned double patterning or SAQP self-aligned quadruple patterning, additionally fix either the width or the space of lines to a specific value. In such case, the flexibility of the disclosure providing a variable height is even more important as in the normal flow, since there is very limited freedom to trade-off R and C in such process flows.

In some situations, a lower resistance (hereafter R) is more important than a low capacitance (hereafter C) such as power supply lines or first segments of long signal wires (close to a driver) which are on a critical path.

In other situations, a lower C is more important, and a higher R is acceptable. This is for example the case for short signal wires, and for the last stretch of long signal wires. This is also the case for signals that are not on critical paths.

The disclosure permits to respond to such issues.

The disclosure also applies to full BEOL stacks where an intermediate metallization layer M1 may be able to connect to a top layer M2 above and to a bottom layer M0 below.

FIG. 3 provides a schematic non limiting example of possible wiring situations where a middle multilevel layer M1, having three levels L0, L1, L2, is located between a lower layer M0 and an upper layer M2. In this example the lower M0 and upper M2 layers are single level layers having lines 33, 34, 38, 39 extending in a direction perpendicular to the lines of the multilevel layer M1.

Some embodiments provide additional routing resources. For example, line 31 may have various thickness segments 31a, 31b and various height segments 31b, 31c. This embodiment also provides connection patterns where separate lines 31, 32 in a same routing track, that is on a same longitudinal axis of the central layer M1, are connected to upper and lower lines 33, 34 of a layer above and a layer under the central layer within a direction perpendicular to the plane of the layer. This is done by adding an isolation layer 29 inserted between the lines 31, 32. This solves the problem of "handshake connections" where two separate lines on a same vertical plane in the same layer are connected separately to a line in an upper layer and a line in a lower layer which are above one other.

Second, this embodiment permits routing two signal lines 36, 37 in the single layer with multilevel routing tracks. In such case, an insulation layer 30 within the three level layer separates the two lines 36, 37 providing what we call "fly-over connections". In the described situation, line 37 has down connections to lines 38, 39 of the lower layer M0 while line 36 may be connected elsewhere.

This configuration permits connecting directly a line of an upper or lower layer with a line of the multilevel layer by routing the line of the multilevel layer respectively in the upper extension level or lower extension level to contact the line respectively in the layer above or in the layer under.

In further embodiments the upper and/or lower layers may be multilevel layer having at least two or three layers to provide more flexibility.

FIG. 4 provides an example of configuration for a full BEOL stack having three multilevel layers M0', M1', M2' each having three layers L0, L1, L2 which provide even more flexibility as each line can be routed up or down in its layer. In this full stack, there are also more options available using contact pads made of up or down localized extensions of the lines.

As examples, lines of one level height 53, 54a may be provided in any level of a layer, line of two levels height 51, 52, 54, 59 may be provided on the uppers or lowers levels of any layer provided that it does not short circuit a line of an adjacent layer. In addition, lines of three levels height such as line 58 for power lines may be provided.

Connection between lines of adjacent layers may use connection pads such as pad 51a between the two level line 51 and the two level line 56 and pad 60a between the two level line 56 and single level line 60. A three level connection pad 55 may also be used to connect a line of the upper layer M2' to the lower layer M0' through the middle multilevel layer M1' such as line 54 in the upper layer M2' connected to line 58 of the lower layer M0' through a three level pad 55.

The use of local pads such as pads 60a and 51a permit to provide connections when two vertically extended lines such as line 56 and 60 and line 56 and 51 that cross each other at noncontiguous levels. The same applies where line 57 connects to a two level line 62 through pad 62a and to a one level line 61 through pad 61a.

Depending on the situation, the selective deposition of this isolation layer can use a relatively relaxed mask and hence be more cost effective than an additional metallization layer that may otherwise be needed to achieve the same layout density.

It should be noted that case the upper layer M2 is a multilevel layer, a first connection between a line of the upper level M2 and the multilayer M1 can be made through a locally arranged down extension or pad of a crossing conductive line in the upper layer and a line of the middle multilevel layer.

In case the lower layer M0 is a multilevel layer a second connection may be made through a locally arranged up extension (pad) of a second crossing conductive line in the lower layer. FIG. 4 provides an example where line 63 has a pad 63a to connect with a line of the middle multilevel layer.

The depicted configuration provides even more flexibility to adapt the resistance and capacitance of the lines. Now, low capacitance lines can be either at the bottom, at the center, or at the top of the layer. Staggering neighboring lines further reduces capacitance as for lines 51 and 52. One can also use this freedom to reduce the coupling between the metallization layers above and below.

The disclosure can be used in other situations.

FIG. 5 represents a prior art source drain connection system in a standard cell 500 in cross section between two gates.

The cell comprises a routing layer 504 comprising a Vss line 501, a Vdd line 502 and signal lines 503a, 503b, 503c. Under the routing layer, are provided a contact layer 505 with contact pads between the routing layer and a middle of line layer 506 above the EPI contact level 507 providing connections for PMOS fins 509 and NMOS fins 510 e.g. neighboring NMOS and PMOS junctions of an inverter.

Such standard configuration does not permit to provide a connection from left track 506c to middle line 503c. In addition, there is a limited spacing 508 between the connection elements 506a, 506b of the fins of the junctions which may raise insulation issues.

Figure 6:
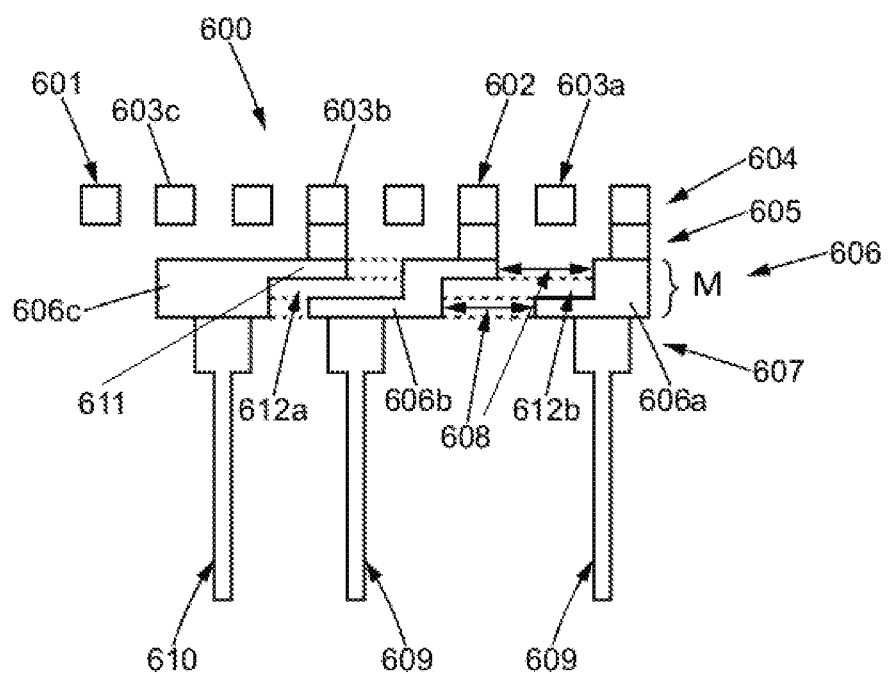
FIG. 6 is a schematic lateral view of an application of the disclosure to the connection system of FIG. 5.

The application of the present disclosure to such a system is shown in FIG. 6 where the cell 600 is similarly depicted in cross section. In this example, the middle of line layer is replaced with a multilevel layer M 606 of the disclosure.

The multilevel layer 606 is located under a connection level 605 to connect upper line layer 604 having Vss line 601, Vdd line 602 and signal lines 603a, 603b, 603c. The connection level 605 and upper line level 604 may be part of a two level layer.

Under the multilevel layer 606 is found the EPI contact level 607 providing connections for PMOS fins 609 and NMOS fins 610.

In this design, a connection 611 can now be done between a line 603b of the routing layer 604 with the contact line of the connection element 606c located in the two lower levels of the multilevel layer 606, through a right extension 611 of line 606c in the upper level of the multilevel layer 606. In such case, an insulating layer 612a separates the contact line from the connection element 606b.

Similarly, additional space for isolation between connection 606b and 606a may also be obtained by routing the connections from 606b to 602 and from 606a to 604 using staggered transitions from level 0 to level 2 of the multilevel layer 606.

The multilevel configuration provides here again more flexibility in routing of signals and an increased robustness of the design.

Such a configuration using a three level middle of line layer may also permit to provide contact lines to buried power lines between junction fins in a lower level of the multilevel layer. By inserting an optional isolating layer at the center level of the buried multilevel layer, two different nets can be routed above one another in a single multilevel routing track. Example use cases are a global vdd net at a bottom level and a local power-gated vdd net at a top level, or a vdd net at a bottom level and a signal net at a top level.

Manufacturing of the layers of the disclosure uses standard techniques used in the integrated circuit field. For the extensions of lines towards the bottom, a modern dual damascene process can be used. For the extensions towards the top, a mask allowing a recessing step of the regions where the top extension is not desired can be used. Alternatively, a masked selective deposition scheme can be used to grow the top extensions.

The process may comprise forming a multilevel layer comprising first parallel electrically conductive lines 20, 21, 22, 23, the multilevel layer comprising at least three levels L0, L1, L2 constituting a centerline level L1, an upper extension line level L2 and a lower extension line level L0. The levels provide multilevel routing tracks in which the conductive lines extend and are aligned.

The lines comprise conductive parts having longitudinal sidewalls perpendicular to the layer plane and inside a multilevel routing track.

In this regard FIGS. 7A to 7F and 8A to 8H represent possible manufacturing processes with a dual damascene process providing construction of a M1 layer on a M0 layer in a semiconductor wafer for fabrication of the integrated circuits comprising the interconnection system of the disclosure.

FIGS. 7A to 7F represent manufacturing lines in an intermediate multilevel layer located on a lower single level layer.

Figure 7A:
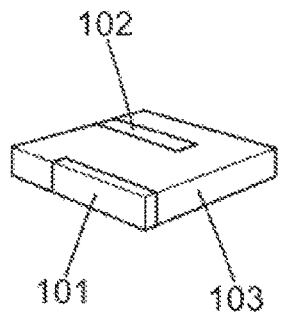
FIGS. 7A to 7F are schematic 3D views of manufacturing steps of a multilevel layer according to an embodiment of the disclosure.
Figure 7B:
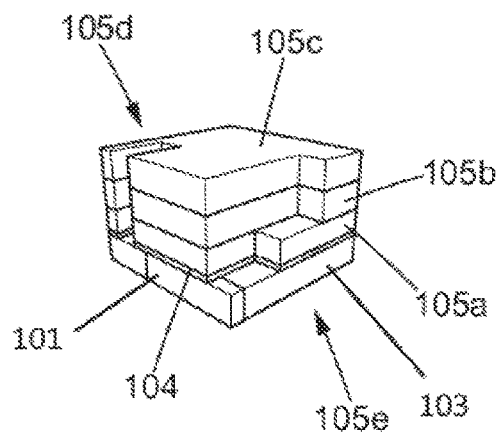

FIG. 7A represents a lower single level layer with two copper lines 101, 102 schematically represented in a dielectric layer 103. In FIG. 7B the multilevel layer of the disclosure starts with the raising of three plies of dielectric layers 105a, 105b, 105c which may be oxide layers such as silicon dioxide, low-k dielectrics (k<silicon oxide), nitride liners, silicon oxide, etc. These plies are formed on an isolation cap 104 having openings above connection parts of the lower single level layer copper lines 101, 102. The dielectric layers 105a, 105b, 105c of the multilevel layer comprise openings or trenches 105d, 105e provided for forming the M1 layer copper lines as in FIG. 7C where line 106 comprises a junction part 106a extending below to contact the first layer line 101 and where line 107 is a three level line that contacts line 102 of the first layer.

The process between steps 7A, 7B and 7C may be a traditional dual damascene process for self-aligned via, but with greater height for the line parts.

Figure 7C:
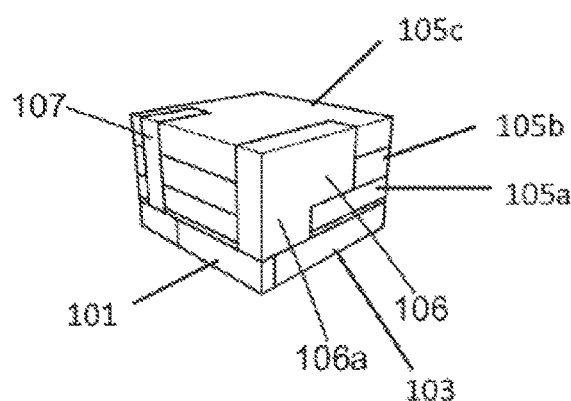
Figure 7D:
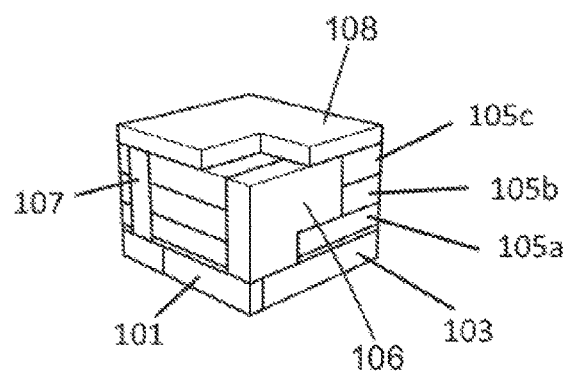
Figure 7E:
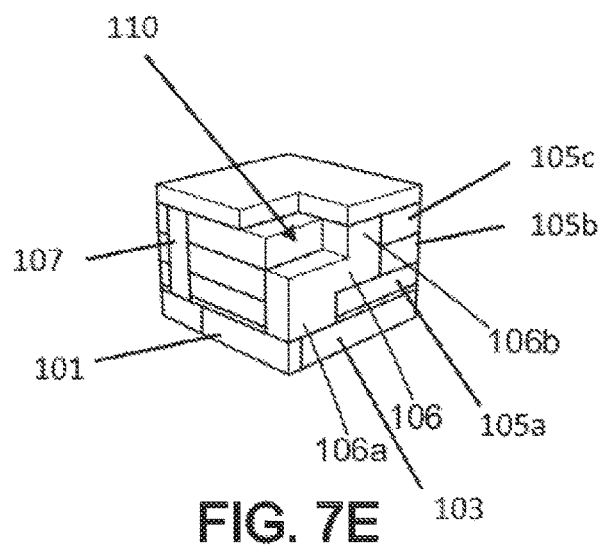

In FIG. 7D a mask 108 is defined through lithography to reveal part of the metal line 106 and in FIG. 7E, an upper part of the line 106 is removed through metal etch back also known as metal recess in order to leave a connection pad 106b on the upper level of layer M1 and a line 106 (which can be longer than represented) extending in the middle level of layer M1.

Figure 7F:
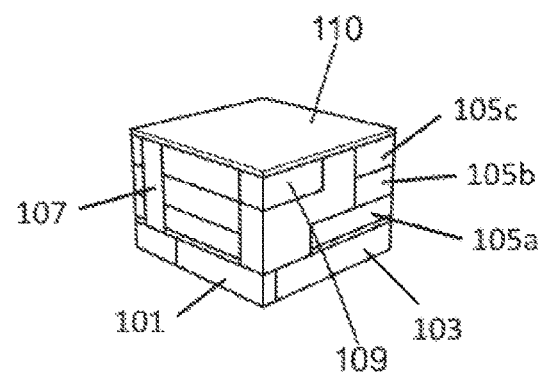

In FIG. 7F, the mask 108 is removed, a dielectric filler 109 finishes the M1 layer and a cap layer 110 is added to finish the layer.

Obviously lines 106, 107 can be built anywhere inside the layer, the drawings showing exposed lines for comprehension only.

FIGS. 8A to 8H represent a process where two isolated separate lines are created above one another in a routing track inside the M1 layer, and a thick line 206 is provided.

Figure 8A:
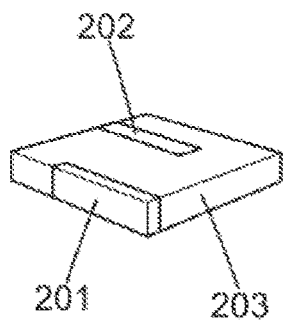
FIGS. 8A to 8H are schematic 3D views of manufacturing steps of a multilevel layer according to another embodiment of the disclosure.
Figure 8B:
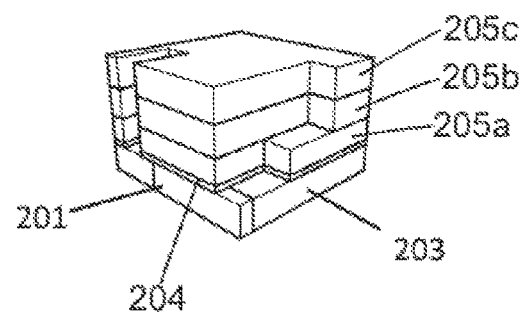
Figure 8C:
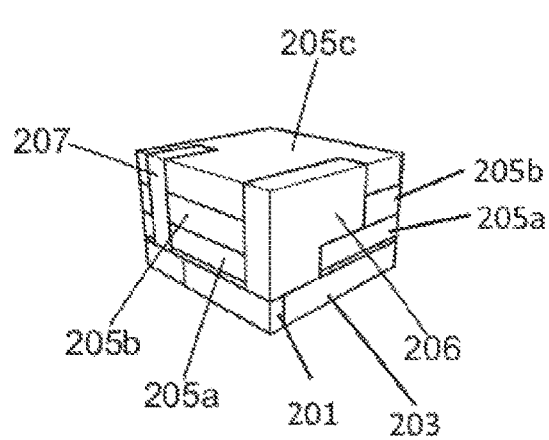

FIG. 8A is the same starting point than FIG. 7A and represents two transverse lines 201, 202 present on a first layer having dielectric 203. In FIGS. 8B and 8C the same construction applies for dielectric layers 205a, 205b, 205c and conductive lines 206, 207 than in FIG. 7B for the layers 105a, 105b, 105c and lines 106, 107.

Figure 8D:
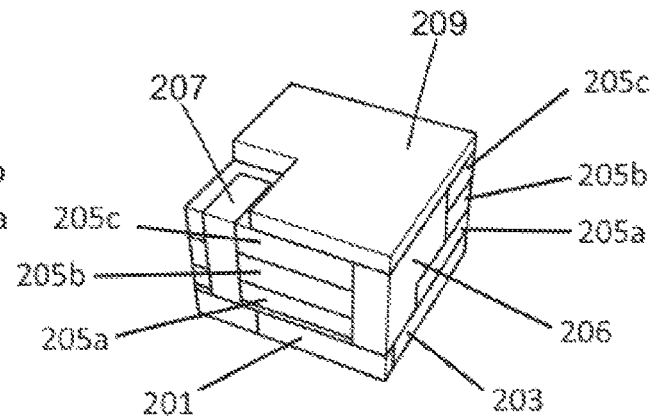
Figure 8E:
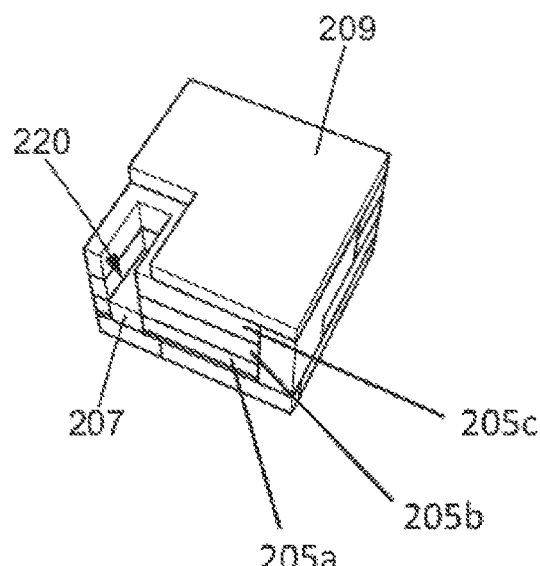

In FIG. 8D a mask using lithography is provided, such mask leaving an exposed metal upper part of line 207. In FIG. 8E, deep metal etch back removes the upper layers of line 207 to create a trench 220 and in FIG. 8F dielectric material 221 is filled in the trench 220 and the mask is removed. In FIG. 8G the upper layer 222 of the added dielectric is removed to provide an insulating spacer 223 and in FIG. 8H an upper conductive 224 line is deposited thus having finished lower line 207a under upper line 224. Further steps such as similar steps than steps 7D to 7F can then be added.

FIGS. 9A to 9I show another example of building a multilevel layer where a line comprises down and up extensions on a previous layer.

Figure 9A:
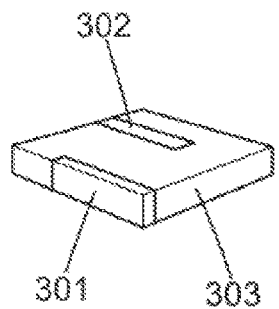
FIGS. 9A to 9I are schematic 3D views of manufacturing steps of a multilevel layer according to another embodiment of the disclosure.
Figure 9B:
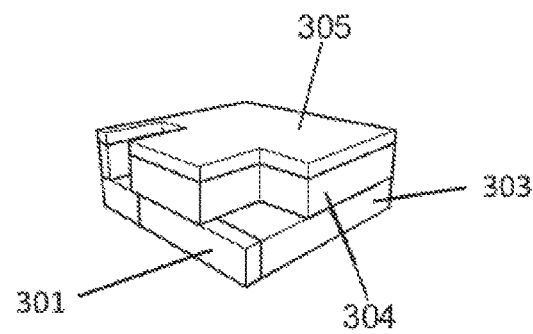

FIG. 9A describes a first layer with two metal lines 302, 302 and dielectric 303. FIG. 9B represents building a first level of the multilevel layer in an intermediate step after dielectric 304 deposition, mask 305 deposition using lithography and dielectric etching. The dielectric etching creates recesses in the dielectric to provide connecting locations to the lines of the former level.

Figure 9C:
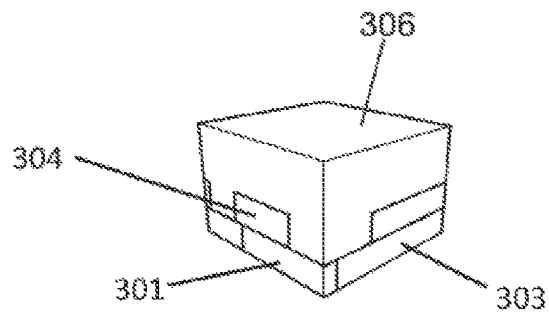

In FIG. 9C, a three level metal layer is deposited, and the top of the metal layer is polished through chemical mechanical planarization.

Figure 9D:
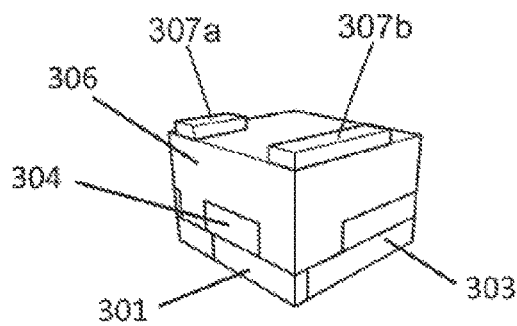
Figure 9E:
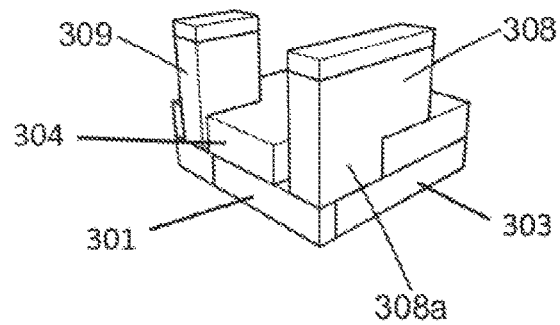

In FIG. 9D, mask elements are deposited on top of the metal layer using a lithographic process and in FIG. 9E the metal is etched using direct metal etching. As can be seen, this process provides self-alignment of the bottom extension 308a of line 308 with line 308. The bottom extension becomes a connecting pad to the line 301 under the multilevel layer.

Figure 9F:
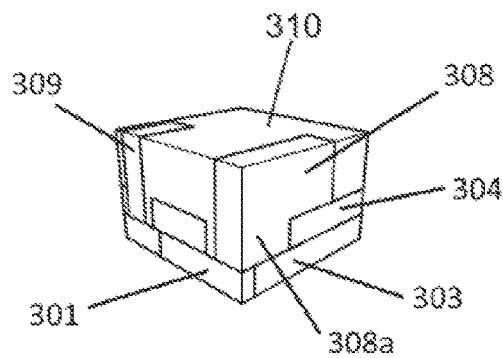

In FIG. 9F, the layer is filled with dielectric and the top of the layer is polished through chemical mechanical planarization.

Figure 9G:
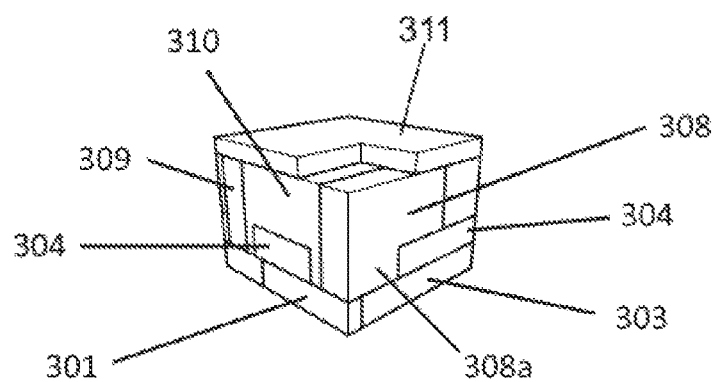

In FIG. 9G a further mask 311 is defined using lithography allowing to recess the line 308 to create a pad 308b which is again self-aligned with the line which is now finished with its bottom and up pads self-aligned and having planar sidewalls from the bottom to the top. In FIG. 9I a last step of filling the recess with dielectric and chemical mechanical planarization is done.

All these process examples show that self-alignment of the extensions which provide connection pads between layers is directly obtained since metal is deposited in the multilevel structure and removed where not needed.

Realization of contact between lines in the layers of the disclosure or between layers in such described process uses masks, metal deposition and metal etching in order to form pads providing a connection only where both extensions overlap. This increases the available margins with respect to the alignment of the connection points between metallization layers.

As disclosed in the figures, building multilevel lines uses deposits of metal in trenches providing directly self-alignment of the line parts in the levels.

To summarize, in the manufacturing process, conductive parts may be formed by dual damascene processing thereby aligning the sidewalls, providing a lithographic pattern 108 as in FIG. 7D, exposing line 106 in the dual damascene stack and etch-back of exposed conductive parts thereby forming a trench 110 as in FIG. 7E, and filling the trench with a dielectric material 109 as in FIG. 7F.

Figure 8F:
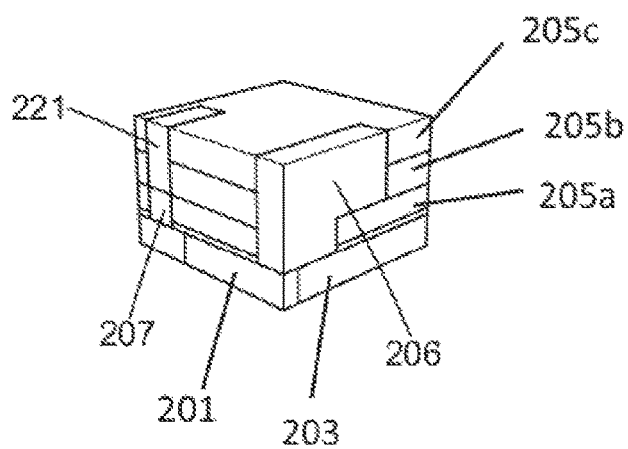
Figure 8G:
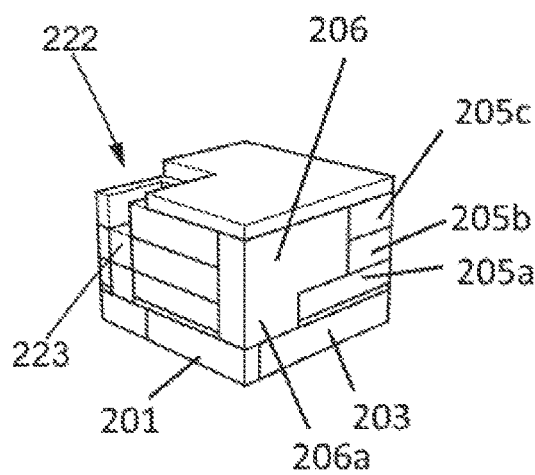
Figure 8H:
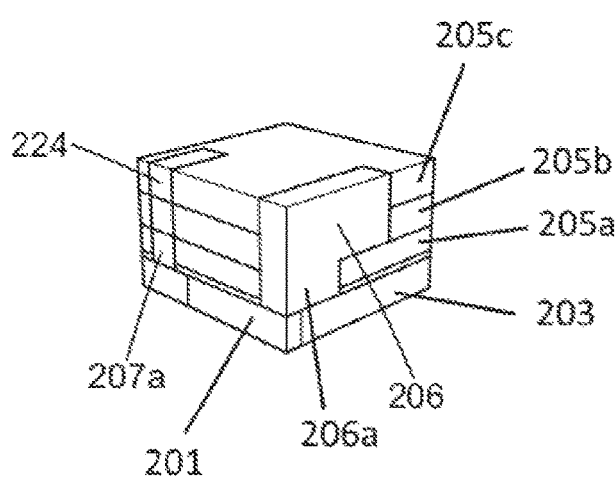

A similar approach is used in FIGS. 8D to 8F where lithographic pattern 209 exposes metal line 207, etch back of conductive part to provide trench 220 which is filled with dielectric 221.

The process may provide further selectively removing the upper portion of the dielectric material 221 in the trench as in FIG. 8G and filling the upper portion 222 of the trench 220 with conductive material 224 to realize an upper line in the multilevel layer above a lower line 207a.

Figure 9H:
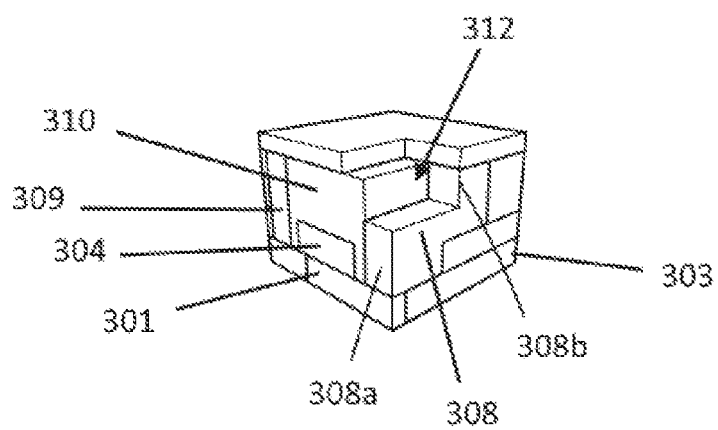
Figure 9I:
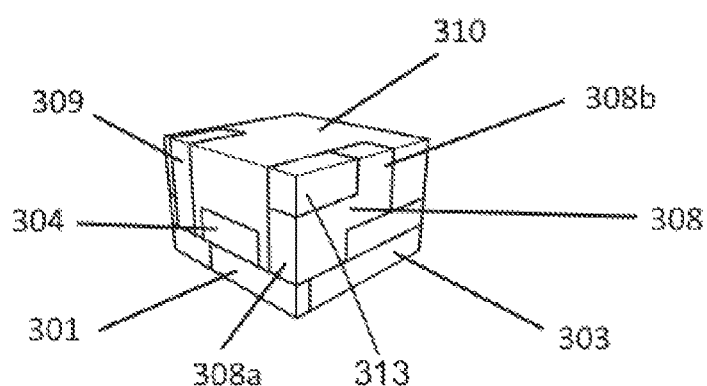

Conductive parts may also be formed by depositing a stack of conductive material(s) 306 as in FIG. 9C, with lithographic masks 307a, 307b patterning the conductive stack 308, 309 through metal etch back as shown in FIG. 9E, forming a dielectric stack 310 surrounding the conductive stack as in FIG. 9F thereby leaving the upper surface of the conductive stack exposed, providing a lithographic pattern 311 as in FIG. 9G exposing part of the upper surface and etch-back of exposed part of the upper portion of the conductive stack thereby forming a trench 312 as in FIG. 9H, and filling the trench with a dielectric material 313 as in FIG. 9I.

In the process, a stack of conductive material(s) 306 can be deposited on a patterned dielectric layer 304 as in FIG. 9C and a stack of patterned dielectric material 205a, 205b, 205c can be provided for depositing conductive material 206, 207 in trenches as in FIG. 8C.

In the manufacturing process, upward extensions of the conductive lines may be provided as in FIGS. 7D, 7E through provision of lithography masking 108 and metal etch-back 111 of exposed conductive lines.

Selective downward extensions can be created by a first step of depositing and patterning an isolating layer as layers 105a, 105b, 105c in FIG. 7B or layer 304 in FIG. 9B, a second step of depositing metal on the patterned isolation layer such as line 106 with downward extension 106a in FIG. 7C or three level layer 306 in FIG. 9C.

The disclosure, which is not limited to the theoretical wirings example described herein, could provide complex multilevel wirings in integrated circuits without using complex via systems.

As the above, application of this disclosure is not limited to BEOL, but there are also opportunities for buried lines (e.g., buried power rails (BPR)) and middle of line (MOL) wirings. In addition, the same approach may be extended to even more layers with more levels if that would be useful economically or performance-wise.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. An integrated circuit comprising:
   an interconnection system, wherein the interconnection system comprises at least one multilevel layer comprising first parallel electrically conductive lines and at least three levels forming a centerline level, an upper extension line level, and a lower extension line level, the at least three levels providing multilevel routing tracks wherein the lines extend, and wherein longitudinal sidewalls of conductive line parts inside a multilevel routing track are self-aligned, wherein at least some of the conductive lines within a multilevel routing track are routed at least locally above one another in the upper extension line level and lower extension line level inside the multilevel routing track, an insulation layer being inserted in the centerline level between the conductive lines routed above one another.

2. The integrated circuit according to claim 1, wherein conductive lines within the multilevel layer comprise upwards extensions or downwards extensions providing conductive lines of varying thickness within the multilevel layer.

3. The integrated circuit according to claim 1, wherein at least one of the conductive lines, within the multilevel routing track layer, changes level upwards or downwards within the centerline level, upper extension line level and lower extension line level.

4. The integrated circuit according to claim 1, wherein the multilevel layer being positioned under an upper layer and a connection between a conductive line of the multilevel layer and a conductive line of the upper layer is made through a locally arranged up extension of the conductive line of the multilevel layer or the multilevel layer being positioned above a lower layer and connections between conductive lines of the multilevel layer and a conductive line of the lower layer is done through a locally arranged down extension of the conductive line of the multilevel layer.

5. The integrated circuit according to claim 4, wherein the multilevel layer is positioned between both a lower layer and an upper layer, the lower and upper layers are multilevel layers and connections between conductive lines of an upper multilevel layer and conductive line of a lower multilevel layer is made through a locally arranged down extension of the conductive line of the upper multilevel layer and locally arranged up extension of the conductive line of the lower multilevel layer.

6. The integrated circuit according to claim 1, wherein the multilevel layer is a middle layer comprising at least locally a first conductive line in the upper extension line level having a first connection to a first crossing conductive line of an upper layer, the middle layer comprising further at least locally a second conductive line in the lower extension line level having a second connection to a second crossing conductive line of a lower layer and wherein an insulating layer is located in the centerline level between the first and second connections, the first and second conductive lines of the middle layer being in the same routing track.

7. The integrated circuit according to claim 1, wherein the multilevel layer comprises at least one conductive line in the upper extension line level and at least one conductive line in the lower extension line level, the conductive lines being separated by an isolation layer providing routing of two different signals on top of each other in the upper extension line level and lower extension line level within the same routing track.

8. The integrated circuit according to claim 1, wherein the multilevel routing track allows provision of variable thickness lines within a layer providing an adaptation between resistance and capacitance of the lines.

9. The integrated circuit according to claim 1, wherein the multilevel routing track allow provision of staggered parallel lines thus reducing capacitive coupling between adjacent lines within the multilevel layer.

10. The integrated circuit according to claim 1, wherein the levels of the multilevel layer are horizontal levels, the multilevel routing tracks provide vertical self-alignment of upper and lower extensions of lines within the layer.

11. The integrated circuit according to claim 1, wherein the interconnection system is provided with at least two multilevel routing tracks layers each having at least three levels.

12. A process for making an interconnection system in an integrated circuit, comprising:
forming a multilevel layer comprising first parallel electrically conductive lines and at least three levels comprising a centerline level, an upper extension line level, and a lower extension line level, wherein the levels provide multilevel routing tracks in which the conductive lines extend, the conductive lines comprising conductive parts having longitudinal sidewalls perpendicular to a plane of the layer, the longitudinal sidewalls of the conductive parts of the lines being aligned inside a multilevel routing track, wherein at least some of the conductive lines within a multilevel routing track are routed at least locally above one another in the upper extension line level and lower extension line level inside the multilevel routing track, an insulation layer being inserted in the centerline level between the conductive lines routed above one another.

13. The process of claim 12, wherein conductive parts are formed by dual damascene processing thereby aligning the sidewalls, providing a lithographic pattern exposing the conductive parts in a dual damascene stack and etch-back of the exposed conductive parts thereby forming a trench, and filling the trench with a dielectric material.

14. The process of claim 13, further comprising selectively removing an upper portion of the dielectric material in the trench, and filling the upper portion of the trench with conductive material.

15. The process of claim 12, wherein conductive parts are formed by depositing a stack of conductive material, patterning the stack of conductive material and forming a dielectric stack surrounding the conductive stack thereby leaving the upper surface of the conductive stack exposed, providing a lithographic pattern exposing part of the upper surface and etch-back of exposed part of the upper portion of the conductive stack thereby forming a trench, and filling the trench with a dielectric material.

16. The process of claim 15, wherein the stack of conductive material is deposited on a patterned dielectric layer.

17. The process according to claim 12, wherein an insulation layer between lines of a layer are provided through provision of a mask, deep metal etch back to remove an upper layer of conductive material to create a trench, filling dielectric material in the trench, removal of the mask, removal of the upper layer of the filled dielectric material to provide an insulating spacer and an upper conductive line is deposited to have finished lower line under upper line.

* * * * *